United States Patent [19]

Ries

[11] Patent Number: 4,635,017
[45] Date of Patent: Jan. 6, 1987

[54] MAGNETIC APPARATUS OF A SYSTEM FOR NUCLEAR SPIN TOMOGRAPHY WITH A SHIELDING DEVICE

[75] Inventor: Günter Ries, Erlangen, Fed. Rep. of Germany

[73] Assignee: Siemens Aktiengesellschaft, Munich, Fed. Rep. of Germany

[21] Appl. No.: 782,502

[22] Filed: Sep. 30, 1985

[30] Foreign Application Priority Data

Oct. 12, 1984 [DE] Fed. Rep. of Germany ....... 3437529

[51] Int. Cl.⁴ ............................................... H01F 7/00
[52] U.S. Cl. ...................................... 335/301; 324/318
[58] Field of Search ............... 335/296, 297, 299, 301; 324/318, 319, 320, 321

[56] References Cited

U.S. PATENT DOCUMENTS 4,156,862 5/1979 Hansen et al. .......................... 336/73
4,490,675 12/1984 Knuettel et al. ................. 324/318 X

FOREIGN PATENT DOCUMENTS 0021535 6/1980 European Pat. Off. .
0111219 6/1984 European Pat. Off. .
7427707 11/1974 Fed. Rep. of Germany .
2921252 12/1979 Fed. Rep. of Germany .
3333755 4/1985 Fed. Rep. of Germany .

Primary Examiner—George Harris
Attorney, Agent, or Firm—Kenyon & Kenyon

[57] ABSTRACT

The magnetic apparatus of a nuclear spin tomography system contains several magnet coils which are surrounded by an approximately cylindrical shielding device of ferromagnetic material. This shielding device comprises at least four beam-like shielding elements of substantially identical design which are arranged regularly distributed in the circumferential direction on a common cylinder surface and, at their end faces, a disc-shaped part with a central opening having a predetermined radius relative to the cylinder axis. In this shielding device, the magnetic stray flux is to be reduced further. For this purpose, the invention provides that at each of the two end faces of the shielding device, two additional shielding plates are arranged parallel to each other such that they extend each of the beam-like shielding elements in the longitudinal direction beyond the corresponding disc-shaped part by a predetermined amount. In addition, at least two elongated shielding plates lying in two parallel planes with a predetermined width can be provided which are parallel to and spaced from the beam-shaped shielding elements of the shielding device and which extend beyond the respective end faces by a predetermined amount.

14 Claims, 4 Drawing Figures

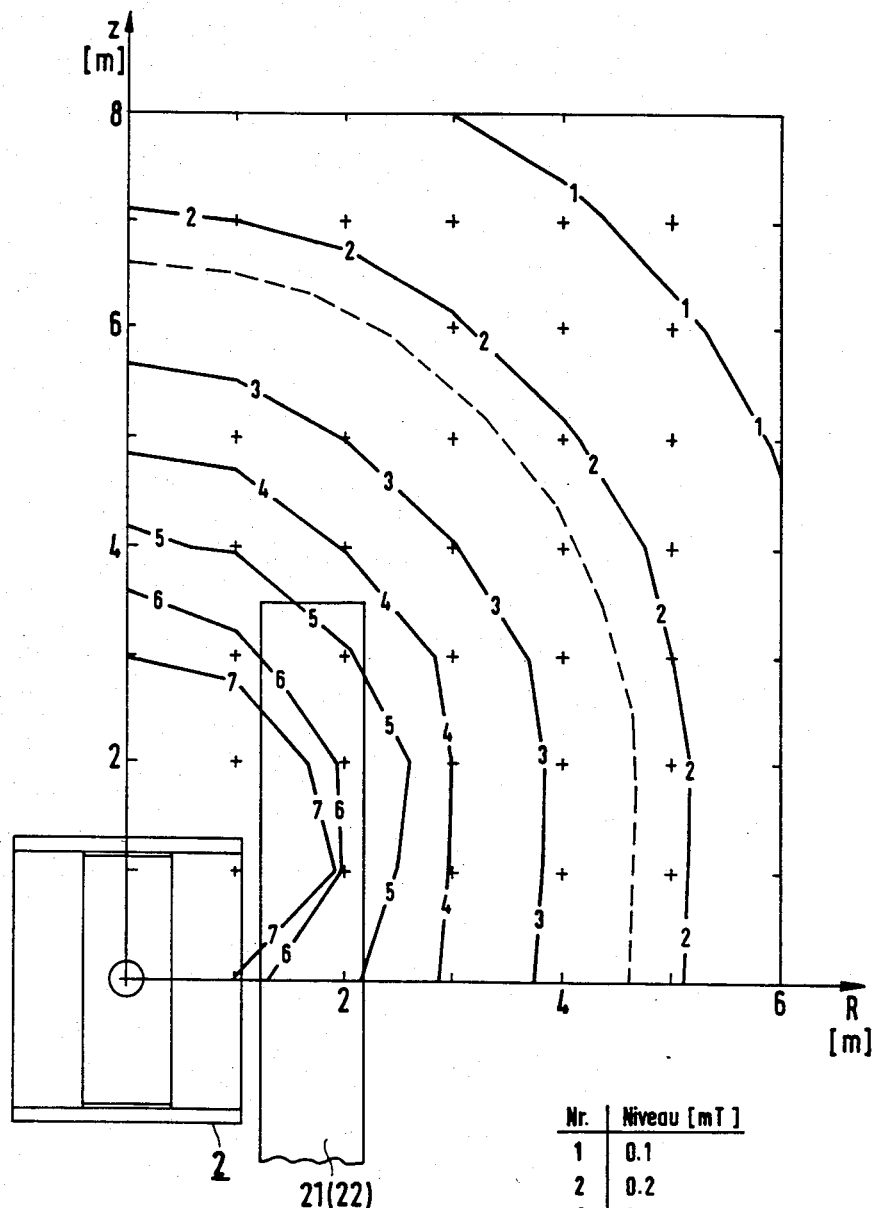

MAGNETIC APPARATUS OF A SYSTEM FOR NUCLEAR SPIN TOMOGRAPHY WITH A SHIELDING DEVICE

BACKGROUND OF THE INVENTION

The subject of the not yet published German Patent Application No. P 33 33 755.1 is a special magnetic device of a system for nuclear spin tomography which is equipped with several magnet coils which surround an interior space suitable for receiving a body to be examined and which generate therein an at least largely homogeneous magnetic field. The coils are surrounded by an approximately cylindrical shielding device of ferromagnetic material which comprises at least four beam-like shielding elements of identical design which are arranged regularly distributed in the circumferential direction on a common cylinder surface and have at their end faces one disclike part each with a central opening having a predetermined radius with respect to the cylinder axis.

Nuclear spin tomography systems (nuclear magnetic resonance (NMR) systems) for medical diagnostics are generally known (see, for instance, European Pat. No. 21 535 A1 or DE-OS No. 29 21 252). Such systems comprise a magnetic device with an arrangement of normal- or, in particular, super-conducting field coils by which a base field as strong as possible can be produced which has sufficiently high homogeneity in a measuring range. This base field is superimposed by pulsed gradient fields. In addition, a high-frequency field which is aligned perpendicularly to the base field must be provided. The dimensions of the corresponding coils must then be adapted to the dimensions of the body to be examined in such a way that the latter can be placed into the measuring range within an interior space surrounded by coils without difficulty. The strong magnetic field of such a coil arrangement is supposed to be substantially only in the measuring range but should if possible not spread into the surroundings of the coil arrangement in the form of a stray field, where it can lead, for instance, to disturbances in certain electromagnetic equipments or can also exert an undesired force action on movable ferromagnetic parts. Magnetic apparatus for nuclear spin tomography therefore comprises advantageously, besides the coil arrangement, also a special shielding device in order to keep the stray field limited outside the coil arrangement.

With the shielding device proposed by the mentioned patent application, a far-reaching return of the magnetic flux around the coil arrangement of the magnetic apparatus can be assured. Thus, the stray field of, for instance, a one-Tesla magnet can be reduced with such a device by a shielding factor of about 4 to 5. Sources of a magnetic stray flux are, however, mainly the central openings in the disc-shaped end plates at the end faces of this shielding device, where the opening diameter is fixed by the requirement of field homogeneity to a predetermined radius of, for instance, about 1.65 m and can therefore not be decreased as desired.

SUMMARY OF THE INVENTION

It is an object of the present invention to improve the proposed shielding device in such a way that a further reduction of the stray flux is made possible.

The above and other objects of the present invention are achieved by the provision that, at each of the two end faces of the shielding device, two shielding plates are additionally arranged parallel to each other such that they extend two of the beam-like shielding elements in the longitudinal direction beyond the corresponding disc-shaped part by a predetermined amount.

With such shielding plates of ferromagnetic material aligned parallel to the axis, the stray flux can be captured as closely as possible at the point of exit from the central openings in the disc-shaped parts (end plates) and can be returned to the respectively opposite side via the cylinder-shaped part of the shielding device. At the same time, the amount of ferromagnetic material and thus the weight of the additional shielding plates can be kept within limits accordingly.

A further solution of the mentioned problem consists in that, in addition, two elongated shielding plates disposed in two parallel planes are provided which are arranged parallel to and spaced from the beam-shaped shielding elements of the shielding device and which protrude beyond the respective end faces by a predetermined amount. In this connection, at least two shielding plates can be disposed in each of the parallel planes, the mutual distance of which is matched to the corresponding width of the cylindrical shielding device. In addition, also only one shielding plate can be provided in each plane, the width of which corresponds at least largely to the width of the cylindrical shielding device.

Also with these additional shielding plates, an effective reduction of the stray flux emanating from the end faces of the cylindrical shielding device can advantageously be achieved.

Advantageous further embodiments of the magnetic apparatus according to the invention will be apparent from the detailed description which follows.

BRIEF DESCRIPTION OF THE DRAWINGS

The invention will be explained in greater detail in the following detailed description with reference to the drawings, in which:

FIGS. 3 and 4 are diagrams of the stray field around a magnetic device without shielding and with shielding according to FIG. 2.

DETAILED DESCRIPTION

With reference now to the drawings, in the illustrated magnetic devices according to the invention, known nuclear spin tomography systems (NMR systems) are taken as a start. These magnetic devices comprise, besides an arrangement of several magnet coils, also special features for shielding and the return of the flux.

Figure 1:
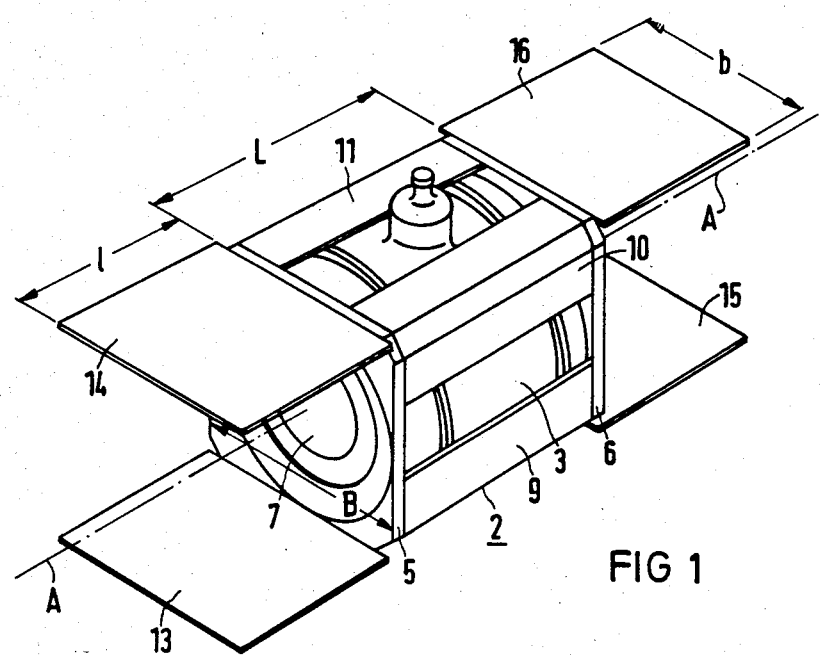
FIG. 1 shows a perspective view of a magnetic device with shielding according to one embodiment of the invention.

An embodiment of the shielding is shown in FIG. 1. A cylindrical shielding device is taken as the basis, such as shown in German Patent Application No. P 33 33 755.1. This device, generally designated with 2 surrounds a cryostat 3, in which superconducting magnet coils for generating a homogeneous base field with a magnetic flux density of, for instance, 1 T or higher are arranged. At the end faces of the cryostat 3, solid plates 5 and 6, each having a round central opening 7, are provided as end poles. The radius of the central opening 7 in the end plates 5 and 6, shaped approximately as equilateral rectangles, is chosen so that on the one hand, sufficient access into the interior of the magnetic device is possible and, on the other hand, the field error in the usable volume about the coil center is minimized. It is fixed therefore and cannot be made smaller without problem to reduce the emitted stray flux because otherwise a considerable field error of the base field would be the result.

The end plates 5 and 6 of the shielding device 2 at the end faces are connected to each other in a magnetically conducting manner via four beam-shaped shielding elements which extend in the longitudinal direction, i.e., parallel to the central magnetic field axis A. In the presentation of the figure, only three of these elements are visible and are designated with 9 to 11. These elements are disposed, regularly distributed with respect to each other, on an imaginary cylinder surface which is arranged concentrically about the axis A. Preferably, all have the same shape and can have any designed cross sectional shape; for instance, they may be rectangular. Especially, however, they have, at least approximately, the cross section of right-angle triangles. According to the embodiment shown, the outer tips of these triangles can be truncated, so that trapezoidal cross sections are obtained.

Together with the approximately square end plates 5 and 6, the beam-shaped shielding elements form a rigid selfsupporting framework, the transverse dimensions of which, in the case of a 1-T magnet coil arrangement, are barely larger than the outside diameter of these coils or the cryostat 3. By means of the cylindrical shielding device 2 formed by this framework, the magnetic flux emanating at the end faces is returned and the stray field is substantially reduced thereby. According to the invention, the stray flux emanating at the end faces can be captured by additional shielding plates, which, in order to be effective, must be arranged as closely as possible at the points of exit of the stray flux at the end faces and must be able to carry the flux to the opposite sides.

According to the embodiment shown in FIG. 1, four additional shielding plates 13 to 16 are provided. Two each of these parallel plates 13, 14 or 15, 16 are attached at one of the two end plates at the end faces 5 or 6 in such a manner that they extend two of the beam-shaped shielding elements of the cylindrical shielding device 2 in the axial direction beyond the respective end plates. Accordingly, the two beam-shaped shielding elements 10 and 11 extend, for instance, between the additional shielding plates 14 and 16 which are disposed in one plane and are fastened at the outer edge of the end plates 5 and 6. In a similar manner, also the shielding plates 13 and 15 are connected to the end plates 5 and 6 and thereby to the corresponding beam-shaped shielding elements The longitudinal dimension 1 of the additional shielding plates 13 to 16 is advantageously at least ½ of the longitudinal dimension L of the cylindrical shielding device 2. In general, the length 1 need not be greater than ⅔ of the length L for an effective reduction of the stray flux. It is of advantage, for instance, if 1 is chosen equal to (⅔)×L. The width b of the plates corresponds at least approximately to the corresponding width B of the end plates 5 and 6, while their thickness is several centimeters and may, for instance, be 1 to 2 cm.

According to a specific embodiment, the shielding device 2 has an axial length L of 2.6 m and a width B of 2.2 m. The shielding plates 13 to 16 which are 2 cm thick with a corresponding width b each have an axial dimension 1 of 1.7 m and rest directly against the corresponding outer edges of the respective end plates. With such an additional shielding, the stray field can be reduced additionally by a factor of 0.7 over the stray field without shielding plates.

Figure 2:
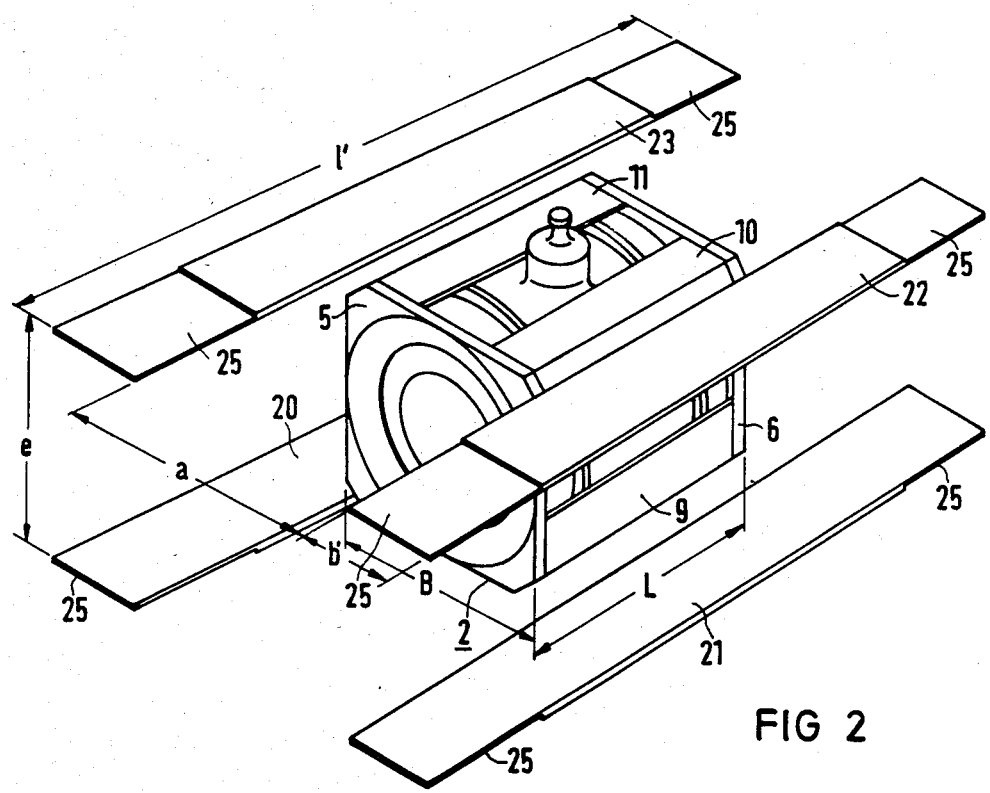
FIG. 2 shows a further embodiment of a shielding according to the invention in a similar presentation.

A further reduction of the stray field over the additional elements shown in FIG. 1 can be obtained with the shielding illustrated in FIG. 2. This arrangement contains, besides the approximately cylindrical shielding device 2 according to FIG. 1 with four beam-shaped shielding elements (9 to 11) and end plates (5, 6) at the end faces, four additional shielding plates 20 to 23. In contrast to the additional shielding plates 13 to 16, according to FIG. 1, which are designed as extensions, the extensions are drawn apart in this embodiment horizontally and divided lengthwise and are extended further in the axial direction. In addition, the captured stray flux is no longer conducted via the cylindrical shielding device itself. The structure so produced, in the form of four plates parallel to the axis, can therefore also be considered as a second flux return besides the cylindrical shielding device. Accordingly, the four elongated shielding plates are arranged parallel and as close as possible to the beam-shaped shielding elements without being connected to the latter in a magnetically conducting manner. In two parallel planes, always two of the shielding plates, mainly, the plates 20 and 21 or 22 and 23, respectively, come to lie with a mutual spacing A. This spacing between the shielding plates lying in one plane is determined by the corresponding dimensions of the cylindrical shielding device 2 and is, for instance, slightly more than its width B. In the same manner, the distance e is determined between the parallel planes, in which always two of the shielding plates are located. The total length 1' of the shielding plates 20 to 23 should be at least 7/3 of the axial length L of the cylindrical shielding device 2 and at most approximately three times this length. Advantageously, a value for 1' is about 2.7×L. The width b' of the shielding plates is advantageously chosen between 0.5 and 1.5 m.

According to a specific embodiment of a shielding device according to FIG. 2, for an approximately cylindrical device 2 according to the embodiment of FIG. 1, shielding plates 20 to 23 with a length 1' of 7 m and with a width b' of 1 m are provided. These plates are about 2 cm thick except for their thickness is reduced to 1 cm in the region of the end pieces 25, mainly for weight reasons. The plates disposed in one plane are spaced from each other by a distance a of 2.4 m, while the distance e between the planes comprising two shielding plates each is approximately 2.35 m. With such a shielding, approximately ½ of the stray flux emerging at the end faces from the cage-like shielding device can be intercepted.

Figure 3:
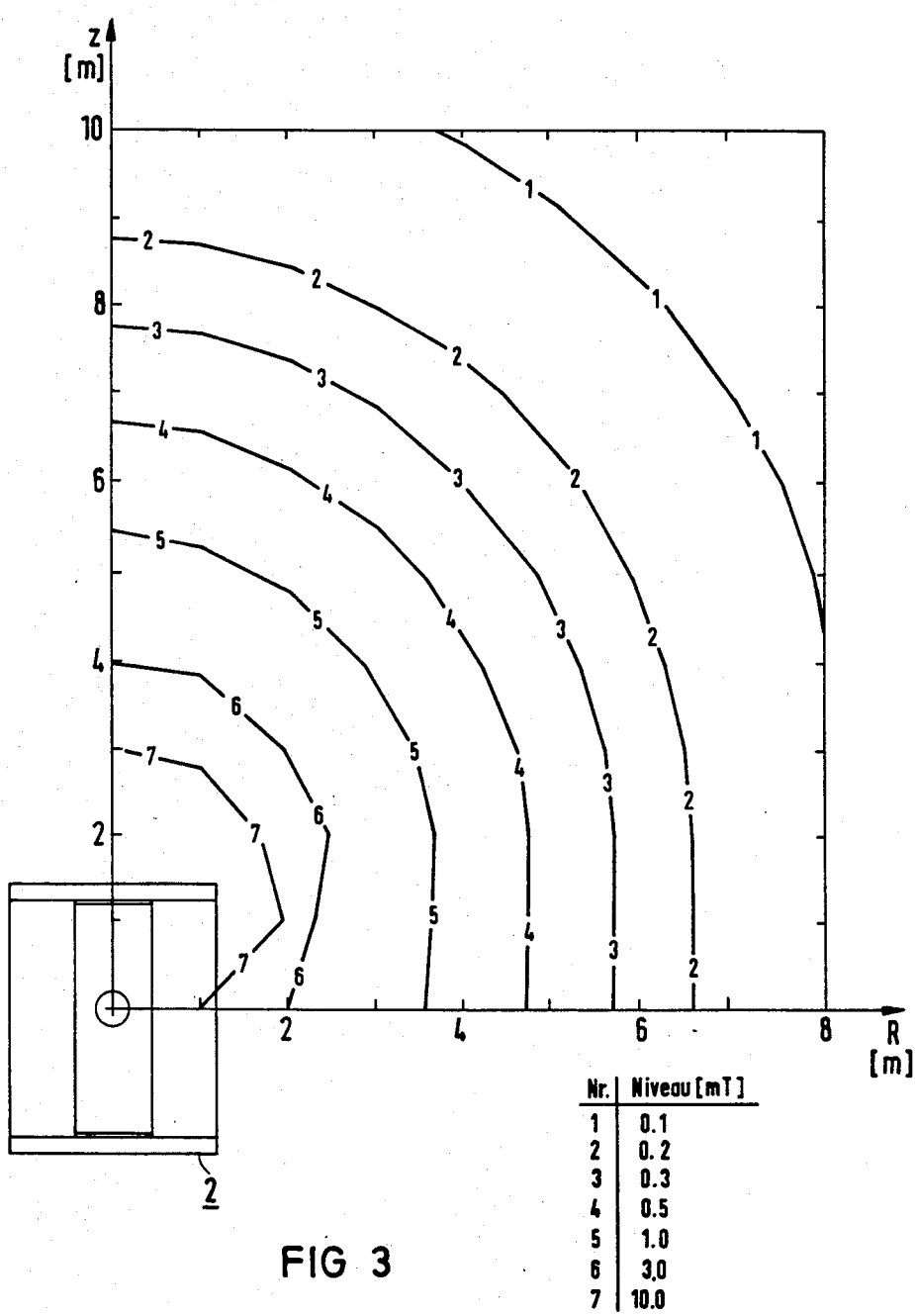

In FIG. 3, the stray field around a 1-T nuclear spin tomography magnet is illustrated in one quadrant of a diagram, which magnet is provided only with an approximately cylindrical shielding device 2 according to the embodiment of FIGS. 1 or 2. On the ordinate z, the distance from the center of the magnet in the direction of the magnetic field axis A is given and on the abscissa R, the corresponding distance in the radial direction, in meters. The location of the shielding device 2 is also entered into the diagram. In the diagram, seven contour lines 1 to 7 are shown which correspond, according to the Table given in this figure, to field levels given in milliteslas.

In a similar presentation, the stray field around a 1-T nuclear spin tomography magnet with the approximately cylindrical shielding device 2 is illustrated in FIG. 4 by individual field level contour lines. In contrast to FIG. 3, however, a shielding is provided here which comprises, besides the shielding device 2, also elongated shielding plates according to the specific embodiment of FIG. 2. A comparison of the diagrams of FIGS. 3 and 4 shows that a substantial reduction of the stray field can be achieved with the additional shielding by means of the shielding plates.

In the embodiment shown in FIG. 2 of a shielding according to the invention, it was assumed that in two parallel planes, always two additional shielding plates (20, 21 or 22, 23) are provided which are arranged on the one hand spaced from the associated beam-shaped shielding elements (9 to 11) of the approximately cylindrical shielding device (2) and on the other hand by a predetermined amount (a) from each other. Instead of the thus four additional shielding plates, only one wider shielding plate can be attached in the two axis-parallel planes above and below the shielding device (2) where then, its respective width corresponds approximately to the width of the shielding device.

The embodiments according to the figures were based on an approximately cylindrical shielding and flux return device, the four beam-shaped shielding elements having approximately triangular or trapezoidal cross sections. The additional shielding features according to FIGS. 1 and 2 are equally well suited also for flux return devices, the beam-like shielding elements of which have other cross sections.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. Magnetic apparatus of a system for nuclear spin tomography having a plurality of magnet coils which surround an interior space suitable for receiving a body to be examined and which generate therein an at least largely homogeneous magnetic field, and having an approximately cylindrical shielding device surrounding the coils, the shielding device comprising ferromagnetic material which comprises at least four substantially identical beam-like shielding elements which are arranged distributed in the circumferential direction regularly on a common cylinder surface and, having at the end faces thereof, a disc-shaped part having a central opening of a predetermined radius relative to the cylinder axis, and wherein, at each of the two end faces of the shielding device, two additional shielding plates are arranged parallel to each other such that they extend two of the beam-like shielding elements in the longitudinal direction beyond the respective disc-shaped part by a predetermined amount.

2. Magnetic apparatus as recited in claim 1, wherein the additional shielding plates are attached to the respective disc-shaped parts in opposite outside regions thereof.

3. Magnetic apparatus as recited in claim 1, wherein the axial length of the additional shielding plates is at least one-half the corresponding extent of the cylindrical shielding device.

4. Magnetic apparatus as recited in claim 1, wherein the axial length of the additional shielding plates is at most ⅔ of the corresponding dimension of the cylindrical shielding device.

5. Magnetic apparatus as recited in claim 1, wherein the width of the additional shielding plates is at least largely equal to the corresponding width of the cylindrical shielding device.

6. Magnetic apparatus of a system for nuclear spin tomography having a plurality of magnet coils which surround an interior space suitable for receiving a body to be examined and which generate therein an at least largely homogeneous magnetic field, and having an approximately cylindrical shielding device surrounding the coils, the shielding device comprising ferromagnetic material which comprises at least four substantially identical beam-like shielding elements which are regularly distributed in the circumferential direction on a common cylinder surface and, having at the end faces thereof, a disc-shaped part having a central opening of a predetermined radius relative to the cylinder axis, and further comprising at least two additional elongated shielding plates lying in two parallel planes, and being arranged parallel to and spaced from the beam-shaped shielding elements of the shielding device, said plates extending by a predetermined amount beyond the respective ends of the end faces.

7. Magnetic apparatus as recited in claim 6, wherein in each of the two parallel planes, at least two shielding plates lie, the mutual distance between which is adapted to the corresponding width of the cylindrical shielding device.

8. Magnetic apparatus as recited in claim 6, wherein a shielding plate, the width of which corresponds at least largely to the width of the cylindrical shielding device, lies in each of the parallel planes.

9. Magnetic apparatus as recited in claim 6, wherein the axial length of the additional shielding plates is at least 7/3 of the corresponding length of the cylindrical shielding device.

10. Magnetic apparatus as recited in claim 6, wherein the axial length of the additional shielding plates is at most 3-times the corresponding length of the cylindrical shielding device.

11. Magnetic apparatus as recited in claim 6, wherein the width of the additional shielding plate is between 0.5 and 1.5 m.

12. Magnetic apparatus as recited in claim 1 wherein the thickness of the additional shielding plates is between 1 and 3 cm.

13. Magnetic apparatus as recited in claim 6, wherein the thickness of the additional shielding plate is between 1 and 3 cm.

14. Magnetic apparatus as recited in claim 6, wherein the thickness of the additional shielding plates in the region of their end faces is smaller than in the region of the cylindrical shielding device.

* * * * *